United States Patent
Seo et al.

(10) Patent No.: US 8,482,027 B2
(45) Date of Patent: Jul. 9, 2013

(54) EPITAXIAL WAFER FOR LIGHT EMITTING DIODE

(75) Inventors: Noriyoshi Seo, Hiki-gun (JP); Atsushi Matsumura, Chichibu (JP); Ryouichi Takeuchi, Chichibu (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 13/255,166

(22) PCT Filed: Feb. 24, 2010

(86) PCT No.: PCT/JP2010/001246
§ 371 (c)(1),
(2), (4) Date: Sep. 7, 2011

(87) PCT Pub. No.: WO2010/103737
PCT Pub. Date: Sep. 16, 2010

(65) Prior Publication Data
US 2011/0316020 A1    Dec. 29, 2011

(30) Foreign Application Priority Data

Mar. 10, 2009   (JP) ................... 2009-056779

(51) Int. Cl.
*H01L 33/00* (2010.01)
*H01L 21/00* (2006.01)

(52) U.S. Cl.
USPC 257/103; 257/94; 257/E33.023; 257/E33.026; 257/E33.027; 257/E33.49; 438/47

(58) Field of Classification Search
USPC ............ 257/94, E33.023, E33.026–E33.027, 257/E33.049; 438/47
See application file for complete search history.

(56) References Cited

U.S. PATENT DOCUMENTS

| | | | |
|---|---|---|---|
| 6,486,491 B1 * | 11/2002 | Najda | 257/18 |
| 2002/0038866 A1 | 4/2002 | Nakatsu et al. | |
| 2006/0001042 A1 * | 1/2006 | Suzuki et al. | 257/103 |
| 2007/0082467 A1 * | 4/2007 | Hata et al. | 438/483 |
| 2009/0135870 A1 * | 5/2009 | Hayat et al. | 372/44.01 |
| 2009/0140273 A1 * | 6/2009 | Takeuchi et al. | 257/94 |
| 2010/0006818 A1 * | 1/2010 | Matsumura | 257/13 |

FOREIGN PATENT DOCUMENTS

| | | |
|---|---|---|
| JP | 04-273173 A | 9/1992 |
| JP | 09-037648 A | 2/1997 |
| JP | 2000-151024 A | 5/2000 |

(Continued)

OTHER PUBLICATIONS

International Search Report for PCT/JP2010/001246 dated Mar. 30, 2010.

Primary Examiner — Cheung Lee
Assistant Examiner — Jeremy Joy
(74) Attorney, Agent, or Firm — Sughrue Mion, PLLC (57) ABSTRACT

An epitaxial wafer for a light emitting diode, including a GaAs substrate, a light emitting unit provided on the GaAs substrate, and a strain adjustment layer provided on the light emitting unit, wherein the light emitting unit has a strained light emitting layer having a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively), and the strain adjustment layer is transparent to the emission wavelength and has a lattice constant that is smaller than the lattice constant of the GaAs substrate. The invention provides an epitaxial wafer that enables mass production of a high-output and/or high-efficiency LED having an emission wavelength of not less than 655 nm.

13 Claims, 4 Drawing Sheets

FOREIGN PATENT DOCUMENTS

| | | |
|---|---|---|
| JP | 2000-164931 A | 6/2000 |
| JP | 2001-274454 A | 10/2001 |
| JP | 2002-027831 A | 1/2002 |
| JP | 2002-111053 A | 4/2002 |
| JP | 3373561 B2 | 2/2003 |
| JP | 2004-165486 A | 6/2004 |
| JP | 2004-221042 A | 8/2004 |
| JP | 2007-019262 A | 1/2007 |
| JP | 2008192790 A * | 8/2008 |

* cited by examiner

EPITAXIAL WAFER FOR LIGHT EMITTING DIODE

CROSS REFERENCE TO RELATED APPLICATIONS

This application is a National Stage of International Application No. PCT/JP2010/001246 filed Feb. 24, 2010, claiming priority based on Japanese Patent Application No. 2009-056779 filed Mar. 10, 2009, the contents of all of which are incorporated herein by reference in their entirety.

TECHNICAL FIELD

The present invention relates to an epitaxial wafer for a light emitting diode, and relates particularly to an epitaxial wafer for a high-output light emitting diode.

BACKGROUND ART

In recent years, plant growth using artificial light sources has been the subject of much research. In particular, cultivation methods using illumination from light emitting diodes (LED), which exhibit excellent monochromaticity, provide favorable energy conservation and long life, and can be easily miniaturized, are garnering much attention. Based on the results of research to date, one emission wavelength band that has been confirmed as a suitable light source for plant growth (photosynthesis) is red light having a wavelength within the region from 600 to 700 nm. Light within the wavelength near 660 to 670 nm exhibits particularly favorable reaction efficacy for photosynthesis, and is thus a preferred light source. Examples of conventional red light emitting diodes of this wavelength that have been investigated include those having light emitting layers composed of AlGaAs and InGaNP and the like (for example, see Patent Documents 1 to 4).

On the other hand, compound semiconductor LEDs having a light emitting layer composed of an aluminum-gallium-indium phosphide (composition formula: $(Al_XGa_{1-X})_YIn_{1-Y}P$, wherein $0 \leq X \leq 1$ and $0 < Y \leq 1$) are also known. Among these LEDs, a light emitting layer having the composition $Ga_{0.5}In_{0.5}P$ exhibits the longest wavelength, and the peak wavelength obtained from this light emitting layer is in the near 650 nm. Accordingly, achieving practical application of, and a high level of brightness for, compound semiconductor LEDs in the region to the long wavelength side of 655 nm has proven problematic.

A light emitting unit having a light emitting layer composed of $(Al_XGa_{1-X})_YIn_{1-Y}P$ (wherein $0 \leq X \leq 1$ and $0 < Y \leq 1$) is formed on a monocrystalline substrate of gallium arsenide (GaAs). At this time, the composition of the above-mentioned light emitting unit is selected so as to match the lattice constant of the GaAs monocrystalline substrate. On the other hand, although investigations have been conducted into light emitting layers having strain for laser devices having a different light emission mechanism, there are currently no practical applications of strained light emitting layers in the field of light emitting diodes (for example, see Patent Document 5).

Furthermore, investigations are also being pursued into light emitting diode light emitting units that utilize a quantum well structure. However, because the quantum effect obtained by utilizing a quantum well structure shortens the emission wavelength, this effect has been unable to be applied to techniques requiring wavelength lengthening (for example, see Patent Document 6).

CITATION LIST

Patent Documents

[Patent Document 1]
Japanese Unexamined Patent Application, First Publication No. Hei 9-37648
[Patent Document 2]
Japanese Unexamined Patent Application, First Publication No. 2002-27831
[Patent Document 3]
Japanese Unexamined Patent Application, First Publication No. 2004-221042
[Patent Document 4]
Japanese Unexamined Patent Application, First Publication No. 2001-274454
[Patent Document 5]
Japanese Unexamined Patent Application, First Publication No. 2000-151024
[Patent Document 6]
Japanese Patent (Granted) Publication No. 3,373,561

DISCLOSURE OF INVENTION

Problems to be Solved by the Invention

However, in order to enable practical application as an illuminating light source for plant growth, energy conservation and cost factors mean that an LED having a high light emission efficiency must be used, and the electric power consumption and number of LEDs used must be reduced. Further, establishment of favorable LED mass production techniques and cost reductions are also important issues.

In particular, in the case of LEDs having an emission wavelength within the 660 nm wavelength band suitable for illumination for plant growth, because conventional LEDs having a light emitting layer composed of AlGaAs exhibit insufficient light output, the development of an LED capable of realizing higher output and/or higher efficiency has been keenly sought.

On the other hand, in the case of high-emission efficiency light emitting layers composed of $(Al_XGa_{1-X})_YIn_{1-Y}P$ (wherein $0 \leq X \leq 1$ and $0 < Y \leq 1$), specific technical issues exist regarding strained light emitting layers for LEDs that may enable lengthening of the emission wavelength to a wavelength of 650 nm or greater, and therefore achieving practical application of, improved efficiency for, and/or mass production of such strained light emitting layers has proven impossible. In particular, lengthening the emission wavelength to at least 655 nm raises problems in terms of controlling the strain within the light emitting layer and achieving mass production of epitaxial wafers having good uniformity of the emission wavelength.

The present invention takes the above circumstances into consideration, with an object of providing an epitaxial wafer that enables mass production of a high-output and/or high-efficiency LED having an emission wavelength of not less than 655 nm.

Means to Solve the Problems

In other words, the present invention relates to the aspects described below.

(1) An epitaxial wafer for a light emitting diode that includes a GaAs substrate, a pn junction-type light emitting unit provided on the GaAs substrate, and a strain adjustment layer provided on the light emitting unit, wherein the light emitting unit has a strained light emitting layer having a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively), and the strain adjustment layer is transparent to the emission wavelength and has a lattice constant that is smaller than the lattice constant of the GaAs substrate.

(2) The epitaxial wafer for a light emitting diode according to aspect (1), wherein the composition formula of the strained light emitting layer is $Ga_YIn_{1-Y}P$ (wherein Y is a number that satisfies $0.39 \leq Y \leq 0.45$).

(3) The epitaxial wafer for a light emitting diode according to aspect (1) or (2), wherein the thickness of the strained light emitting layer is within a range from 8 to 30 nm.

(4) The epitaxial wafer for a light emitting diode according to any one of aspects (1) to (3), wherein the composition formula of the strain adjustment layer is $(Al_XGa_{1-X})_YIn_{1-Y}P$ (wherein X and Y are numerical values that satisfy $0 \leq X \leq 1$ and $0.6 \leq Y \leq 1$ respectively).

(5) The epitaxial wafer for a light emitting diode according to any one of aspects (1) to (3), wherein the composition formula of the strain adjustment layer is $Al_XGa_{1-X}As_{1-Y}P_Y$ (wherein X and Y are numerical values that satisfy $0 \leq X \leq 1$ and $0.6 \leq Y \leq 1$ respectively).

(6) The epitaxial wafer for a light emitting diode according to any one of aspects (1) to (3), wherein the material of the strain adjustment layer is GaP.

(7) The epitaxial wafer for a light emitting diode according to any one of aspects (1) to (6), wherein the thickness of the strain adjustment layer is within a range from 0.5 to 20 μm.

(8) The epitaxial wafer for a light emitting diode according to any one of aspects (1) to (7), wherein the light emitting unit has a stacked structure composed of the strained light emitting layer and a barrier layer, and the strained light emitting layer contains 8 to 40 layers.

(9) The epitaxial wafer for a light emitting diode according to any one of aspects (1) to (8), wherein the composition formula of the barrier layer is $(Al_XGa_{1-X})_YIn_{1-Y}P$ (wherein X and Y are numerical values that satisfy $0.3 \leq X \leq 0.7$ and $0.49 \leq Y \leq 0.52$ respectively).

(10) The epitaxial wafer for a light emitting diode according to any one of aspects (1) to (9), wherein a cladding layer is provided on one or both of the upper surface and the lower surface of the light emitting unit, and the composition formula of the cladding layer is $(Al_XGa_{1-X})_YIn_{1-Y}P$ (wherein X and Y are numerical values that satisfy $0.5 \leq X \leq 1$ and $0.48 \leq Y \leq 0.52$ respectively).

(11) The epitaxial wafer for a light emitting diode according to any one of aspects (1) to (10), wherein the range for the planar orientation of the GaAs substrate is 15°±5° off the (100) direction towards the (0-1-1) direction.

(12) The epitaxial wafer for a light emitting diode according to any one of aspects (1) to (11), wherein the diameter of the GaAs substrate is not less than 75 mm.

(13) The epitaxial wafer for a light emitting diode according to aspect (12), wherein the amount of warping is not more than 200 μm.

(14) The epitaxial wafer for a light emitting diode according to any one of aspects (1) to (13), which is used for promoting photosynthesis during plant growth, and wherein the peak emission wavelength of the strained light emitting layer is within a range from 655 to 675 nm.

(15) The epitaxial wafer for a light emitting diode according to aspect (14), wherein the light emission intensity of the strained light emitting layer at an emission wavelength of 700 nm is less than 10% of the light emission intensity at the peak emission wavelength.

Effects of the Invention

In the epitaxial wafer for a light emitting diode according to the present invention, a light emitting unit having a strained light emitting layer with a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively) is provided on a GaAs substrate. By employing AlGaInP as the material for the strained light emitting layer, the light emission efficiency of the strained light emitting layer can be improved. Further, by restricting the composition of the strained light emitting layer to the ranges described above, the emission wavelength from the strained light emitting layer can be adjusted to not less than 655 nm.

Further, in the epitaxial wafer for a light emitting diode according to the present invention, a strain adjustment layer is provided on the light emitting unit. This strain adjustment layer is transparent to the emission wavelength, and therefore absorbs none of the emitted light from the light emitting unit when an LED is produced using the epitaxial wafer. Moreover, this strain adjustment layer has a smaller lattice constant than the lattice constant of the GaAs substrate, and therefore warping of the overall epitaxial wafer can be reduced. As a result, the occurrence of defects within the strained light emitting layer can be suppressed.

Accordingly, the epitaxial wafer for a light emitting diode according to the present invention is able to provide an epitaxial wafer that enables mass production of a high-output and/or high-efficiency LED having an emission wavelength of not less than 655 nm. Further, when a light emitting diode is produced using the epitaxial wafer of the present invention, a high-output light emitting diode can be obtained that has a light emission efficiency that is three times or more that of a light emitting diode (LED) that uses a conventional AlGaAs-based light emitting layer.

EMBODIMENTS FOR CARRYING OUT THE INVENTION

As follows is a detailed description of an epitaxial wafer for a light emitting diode, which represents one embodiment of the application of the present invention, and a light emitting diode chip that uses the epitaxial wafer, with reference to the drawings. This embodiment has a typical device structure in which electric current flows vertically. The drawings used in the following description have in some cases been drawn with certain features enlarged, in order to assist with comprehension of those features, and as a result, the dimensional ratios between each of the structural components in the drawings may not necessarily represent the actual ratios.

<Epitaxial Wafer for Light Emitting Diode>

Figure 1:
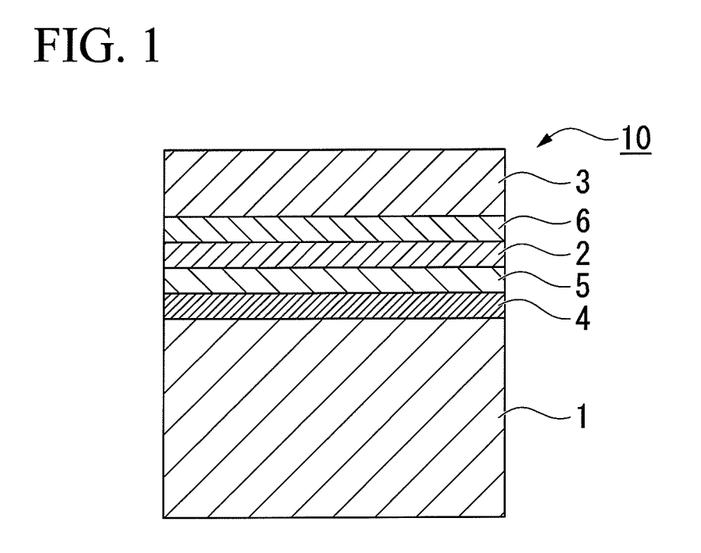
FIG. 1 is a cross-sectional schematic view illustrating an epitaxial wafer for a light emitting diode according to an embodiment of the present invention.

FIG. 1 is a cross-sectional schematic view describing the structure of an epitaxial wafer for a light emitting diode that represents one embodiment of the application of the present invention. As illustrated in FIG. 1, a light emitting diode epitaxial wafer 10 of this embodiment (hereinafter referred to as the epiwafer 10) is composed basically of a GaAs substrate 1, a pn junction-type light emitting unit 2 provided on the GaAs substrate 1, and a strain adjustment layer 3 provided on the light emitting unit 2. More specifically, the epiwafer 10 has a device structure that includes a buffer layer 4 composed of GaAs, a lower cladding layer 5, the light emitting unit 2, an upper cladding layer 6 and the strain adjustment layer 3 stacked sequentially on top of the GaAs substrate 1. In the present embodiment, the buffer layer 4, the lower cladding layer 5, the light emitting unit 2, the upper cladding layer 6 and the strain adjustment layer 3 may sometimes be referred to jointly as the epitaxial growth layers.

This device structure may also include conventional functional layers. For example, conventional layer structures such as a contact layer for reducing the contact resistance of the ohmic electrode, an electric current diffusion layer for achieving planar diffusion of the device drive current across the entire light emitting unit, or in contrast, a current inhibition layer or current constriction layer for restricting the region through which the device drive current is able to flow, may be provided as required. Furthermore, other conventional layer structures such as a reflective layer (DBR layer) may also be provided on the GaAs substrate 1.

The GaAs substrate 1 may use a commercially available monocrystalline substrate produced using conventional production methods. The surface of the GaAs substrate 1 upon which epitaxial growth is to be performed is preferably smooth. In terms of ensuring ease of epitaxial growth, the planar orientation of the surface of the GaAs substrate 1 is preferably the mass-produced (100) plane and within a range of ±20° off the (100) plane in terms of quality stability. Moreover, the planar orientation of the surface of the GaAs substrate 1 is more preferably 15°±5° off the (100) direction towards the (0-1-1) direction.

In order to improve the crystallinity of the epitaxial growth layers, the dislocation density of the GaAs substrate 1 is preferably low. Specifically, the dislocation density is typically not more than 10,000 cm$^{-2}$, and preferably not more than 1,000 cm$^{-2}$.

The GaAs substrate 1 may be an n-type or p-type substrate. The carrier concentration of the GaAs substrate 1 may be selected as appropriate in order to achieve the desired electrical conductivity and device structure. For example, in the case where the GaAs substrate 1 is a silicon-doped n-type substrate, the carrier concentration is preferably within a range from $1\times10^{17}$ to $5\times10^{18}$ cm$^{-3}$. In contrast, in the case where the GaAs substrate 1 is a zinc-doped p-type substrate, the carrier concentration is preferably within a range from $2\times10^{18}$ to $5\times10^{19}$ cm$^{-3}$.

The thickness of the GaAs substrate 1 may be set within an appropriate range in accordance with the substrate size. If the thickness of the GaAs substrate 1 is thinner than this appropriate range, then there is a danger of breakage occurring during the production process for the epiwafer 10, resulting in a reduction in yield. In contrast, if the thickness of the GaAs substrate 1 is thicker than the appropriate range, then the material costs increase. Accordingly, in those cases where the substrate size of the GaAs substrate 1 is large, for example in the case of a substrate having a diameter of 75 mm, the substrate thickness is preferably within a range from 250 to 500 μm in order to prevent breakage during handling. Similarly, if the substrate diameter is 50 mm, then the thickness is preferably within a range from 200 to 400 μm. In the case of a substrate diameter of 100 mm, the thickness is preferably within a range from 350 to 600 μm. In the present embodiment, from the viewpoint of productivity, the diameter of the GaAs substrate 1 is preferably at least 75 mm.

By setting the thickness of the substrate in accordance with the substrate size of the GaAs substrate 1 in this manner, warping of the epiwafer 10 caused by the strained light emitting layer 7 described below can be reduced. As a result, the temperature distribution during epitaxial growth becomes more uniform, meaning the wavelength distribution within the plane of the epiwafer 10 can be narrowed. The shape of the GaAs substrate 1 is not limited to circular shapes, and a rectangular shape or the like may also be used.

Figure 2:
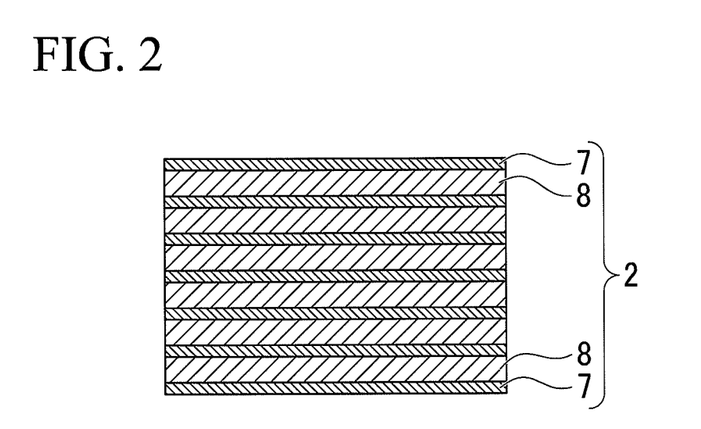
FIG. 2 is a cross-sectional schematic view illustrating the light emitting unit of an epitaxial wafer for a light emitting diode according to an embodiment of the present invention.

As illustrated in FIG. 1, the light emitting unit 2 forms a double hetero structure in combination with the lower cladding layer 5 and the upper cladding layer 6. Further, the light emitting unit 2 controls the emission wavelength when the epiwafer 10 is used to produce a light emitting diode (LED), and therefore preferably has a well structure. In other words, as illustrated in FIG. 2, the light emitting unit 2 is preferably a multilayer structure composed of strained light emitting layers 7 and barrier layers 8 in which a strained light emitting layer (also referred to as a well layer) 7 is positioned at each of the two outer edges of the structure.

The thickness of the light emitting unit 2 is preferably within a range from 0.02 to 2 μm. Further, there are no particular limitations on the conduction type of the light emitting unit 2, and an undoped, p-type or n-type unit may be selected. In order to enhance the light emission efficiency, either an undoped unit or a unit having a carrier concentration of less than $3\times10^{17}$ cm$^{-3}$, which offers more favorable crystallinity, is preferred.

Each of the strained light emitting layers 7 has a composition represented by $(Al_XGa_{1-X})_YIn_{1-Y}P$ (wherein X and Y are numerical values that satisfy $0 \leq X \leq 1$ and $0 < Y \leq 1$ respectively). The value of X is preferably not more than 0.1, and is more preferably 0. Further, the value of Y is preferably within a range from 0.37 to 0.46, and more preferably within a range from 0.39 to 0.45.

The thickness of each strained light emitting layer 7 is preferably within a range from 8 to 30 nm. If the strained light emitting layer 7 is a thin film with a thickness of less than approximately 6 nm, then a quantum effect of the well structure causes a shortening of the emission wavelength, making it impossible to achieve the desired emission wavelength of 655 nm or greater. Accordingly, allowing for fluctuation in the thickness, the thickness of the strained light emitting layer 7 is preferably at least 8 nm in order to prevent quantum effects. In consideration of ease of control of the thickness, a thickness of at least 10 nm is preferred. On the other hand, if the thickness of the strained light emitting layer 7 exceeds 30 nm, then the amount of strain tends to become too great, which increases the likelihood of crystal defects and surface anomalies, and is therefore undesirable.

Each of the barrier layers 8 has a composition represented by $(Al_XGa_{1-X})_YIn_{1-Y}P$ (wherein X and Y are numerical values that satisfy 0≦X≦1 and 0<Y≦1 respectively). The value of X is preferably within a range from 0.3 to 0.7, and is more preferably within a range from 0.4 to 0.6. Further, the value of Y is preferably within a range from 0.48 to 0.52, more preferably within a range from 0.49 to 0.52, and most preferably within a range from 0.49 to 0.51.

The thickness of each barrier layer 8 is preferably greater than the thickness of the strained light emitting layer 7. This enables the light emission efficiency of the strained light emitting layers 7 to be increased. Further, as well as optimizing the light emission efficiency, the barrier layers 8 must also alleviate the strain generated within the strained light emitting layers 7. Accordingly, the thickness of each barrier layer 8 is preferably at least 15 nm, and is more preferably 20 nm or greater. On the other hand, if the thickness of the barrier layer 8 exceeds 50 nm, then it approaches the emission wavelength, and optical effects may arise such as light interference or Bragg reflection. Accordingly, the thickness of each barrier layer 8 is preferably not more than 50 nm, and more preferably 40 nm or less. As mentioned have, adopting a structure in which the strained light emitting layer 7 is relatively thinner and the barrier layer 8 is relatively thicker enables the strain of the strained light emitting layer 7 to be absorbed by the barrier layer 8, reducing the likelihood of crystal defects in the strained light emitting layer 7.

In the multilayer structure composed of the strained light emitting layers 7 and the barrier layers 8, there are no particular limitations on the number of alternately stacked pairs of layers, with each pair composed of a strained light emitting layer 7 and a barrier layer 8, but at least 8 pairs and not more than 40 pairs is preferable. In other words, the light emitting unit 2 preferably includes from 8 to 40 strained light emitting layers 7. Achieving favorable light emission efficiency for the light emitting unit 2 requires at least 8 strained light emitting layers 7. On the other hand, because the strained light emitting layers 7 and the barrier layers 8 have low carrier concentration levels, if the number of pairs of layers is too large, then the forward voltage (VF) tends to increase. Consequently, the number of pairs of layers is preferably not more than 40, and more preferably 30 or less. Furthermore, the strain within the strained light emitting layer 7 is a stress that occurs within the light emitting unit 2 as a result of the difference in lattice constants between the epitaxial growth substrate and the light emitting unit 2. Accordingly, if the number of alternately stacked pairs of the strained light emitting layer 7 and the barrier layer 8 exceeds the above range, namely if the number of strained light emitting layers 7 contained within the light emitting unit 2 exceeds the above range, then the light emitting unit 2 is unable to withstand the strain, resulting in the generation of crystal defects and the occurrence of problems such as a deterioration in the surface state and a reduction in the light emission efficiency.

Figure 3:
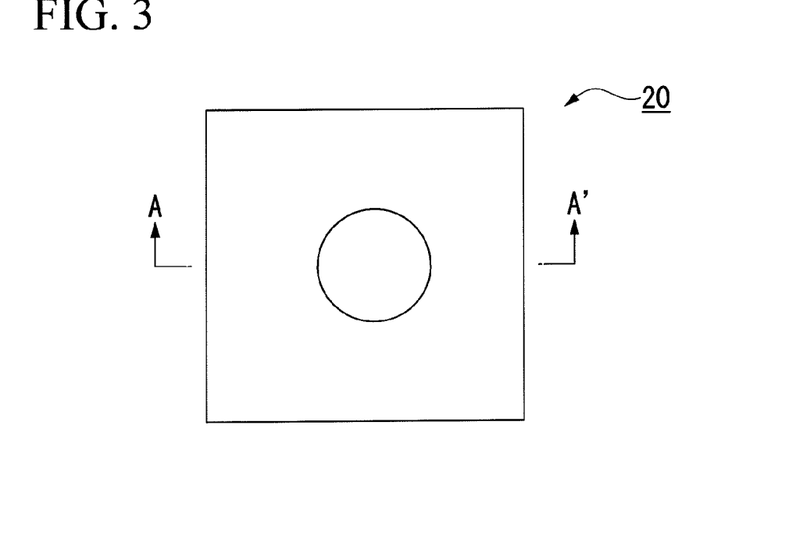
FIG. 3 is a plan view illustrating a light emitting diode according to an embodiment of the present invention.
Figure 4:
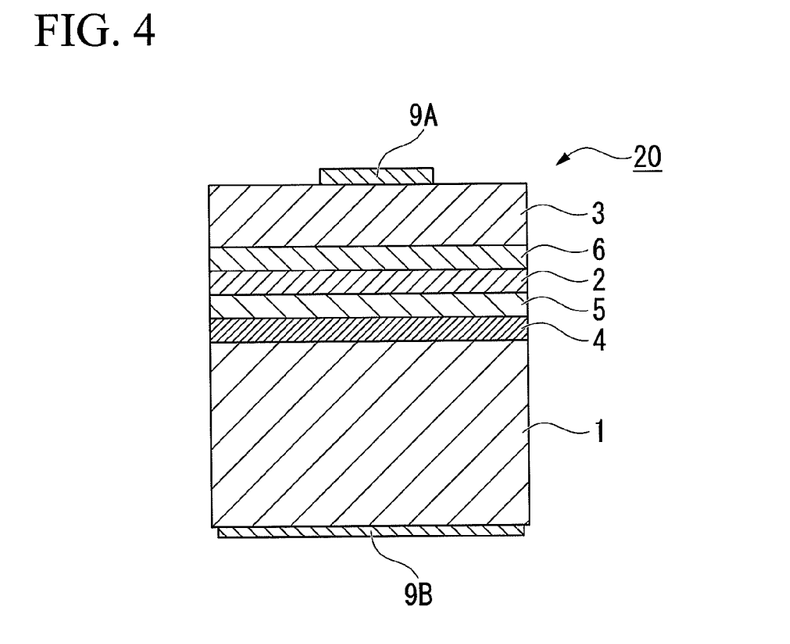
FIG. 4 is a cross-sectional schematic view along the line A-A' in FIG. 3 of a light emitting diode according to an embodiment of the present invention.

In those cases where, as illustrated in FIG. 3 and FIG. 4, a device structure is employed in which the current flows vertically through the device (a light emitting diode 20), the strained light emitting layers 7 preferably exhibit a peak emission wavelength within a range from 655 to 675 nm, and more preferably within a range from 660 to 670 nm. An emission wavelength within this range is known to be an emission wavelength that is suitable as a light source for plant growth (photosynthesis), and exhibits a high degree of reaction efficacy for photosynthesis.

On the other hand, if light within the long wavelength region of 700 nm or greater is used, then a reaction that inhibits plant growth occurs, and therefore the amount of light within this long wavelength region is preferably minimized. Accordingly, in order to achieve efficient plant growth, red light sources for which the intensity of light within the wavelength region from 655 to 675 nm that is ideal for promoting photosynthesis is strong, but which include no light in the long wavelength region of 700 nm or greater, are the most desirable.

Furthermore, the light emission intensity from the strained light emitting layer 7 at an emission wavelength of 700 nm is preferably less than 10% of the light emission intensity at the above-mentioned peak emission wavelength. A light emitting diode produced using an epiwafer 10 containing strained light emitting layers 7 with these types of characteristics can be used favorably as illumination for promoting photosynthesis during plant growth. Furthermore, in terms of the structure of the strained light emitting layers 7, the composition, thickness and number of layers may be selected so as to satisfy the above characteristics.

As illustrated in FIG. 1, the strain adjustment layer 3 is provided on top of the light emitting unit 2 with the upper cladding layer 6 disposed therebetween. Further, the strain adjustment layer 3 is transparent to the emission wavelength from the light emitting unit 2 (the strained light emitting layers 7). Moreover, the strain adjustment layer 3 has a lattice constant that is smaller than the lattice constant of the above-mentioned GaAs substrate 1.

As the strain adjustment layer 3, a material having a composition represented by $(Al_XGa_{1-X})_YIn_{1-Y}P$ (wherein X and Y are numerical values that satisfy 0≦X≦1 and 0.6≦Y≦1 respectively) can be used. The value of X varies depending on the device structure of the epiwafer 10, but because materials having a low Al concentration are chemically stable, X is preferably not more than 0.5, and is most preferably 0. Further, the lower limit for the value of Y is preferably at least 0.6. If a comparison is made between structures in which the strain within the light emitting unit 2 (the strained light emitting layers 7) is the same, then a smaller value of Y results in a reduction in the size of the strain adjustment effect provided by the strain adjustment layer 3. This means that the thickness of the strain adjustment layer 3 must be increased, resulting in increased time and cost for deposition of the strain adjustment layer 3, and therefore the value of Y is preferably at least 0.6, and is more preferably 0.8 or greater.

Further, a group III-V semiconductor material that is transparent to the emission wavelength and has a composition represented by $Al_XGa_{1-X}As_{1-Y}P_Y$ (wherein X and Y are numerical values that satisfy 0≦X≦1 and 0.6≦Y≦1 respectively) may also be used favorably as the strain adjustment layer 3. In the case of a strain adjustment layer 3 having this composition, the lattice constant varies depending on the value of Y. Larger values of Y result in a smaller lattice constant. Further, the degree of transparency relative to the emission wavelength is related to the values of both X and Y, and therefore the values of X and Y are typically selected so as to achieve an appropriately transparent material.

Moreover, GaP may also be used as the strain adjustment layer 3. This GaP requires no adjustment of the composition and also exhibits a large strain adjustment effect, and is therefore the most preferred material for the strain adjustment layer 3 in terms of productivity and stability.

The strain adjustment layer 3 has a smaller lattice constant than that of the GaAs substrate 1 that functions as the epitaxial growth substrate, and therefore has the ability to alleviate fluctuations in the amount of strain incorporated within the strained light emitting layer 7. Accordingly, providing the strain adjustment layer 3 has the effects of improving the uniformity of properties such as the emission wavelength, and preventing the occurrence of crystal defects such as cracks. The thickness of the strain adjustment layer 3 is preferably within a range from 0.5 to 20 μm, and is more preferably within a range from 3 to 15 μm.

If the thickness is less than 0.5 μm, then the layer thickness is insufficient to alleviate fluctuations in the amount of strain incorporated within the strained light emitting layer 7, whereas if the thickness exceeds 20 μm, then the growth time becomes overly long, and the associated costs increase undesirably.

Furthermore, by controlling the composition of the strain adjustment layer 3, warping of the epiwafer 10 can be reduced even in those cases where a thin GaAs substrate 1 is used, and therefore an epiwafer 10 having a narrow in-plane wavelength distribution can be produced. For substrates of the same thickness, the amount of warping of the epiwafer 10 increases as the size of the GaAs substrate 1 increases. However, by controlling the composition of the strain adjustment layer 3, warping of the epiwafer 10 can be reduced even in those cases where, for example, a large diameter GaAs substrate 1 with a diameter of 75 mm or greater is used. Moreover, in the case of structures where a functional substrate and the epiwafer 10 are bonded together in order to achieve increased brightness, if the amount of warping of the epiwafer 10 is large, then problems such as cracking may occur, and therefore it is desirable to minimize warping of the epiwafer 10. The amount of warping of the epiwafer 10, for example in the case where a GaAs substrate 1 having a diameter of 75 mm or greater is used, is preferably not more than 200 μm, and more preferably 150 μm or less. Warping tends to increase as the substrate size increases. For example, in the case of a substrate size of 75 mm, although the warping varies depending on the composition of the strain adjustment layer and the strained light emitting layer, and the thickness of the substrate, the amount of warping is typically within a range from approximately 50 to 150 μm. Further, in the case of a substrate size of 100 mm, although the warping varies depending on the composition of the strain adjustment layer and the strained light emitting layer, and the thickness of the substrate, the amount of warping is typically within a range from approximately 80 to 200 μm. In other words, the substrate size is preferably not less than 75 mm and not more than 100 mm.

Figure 5A:
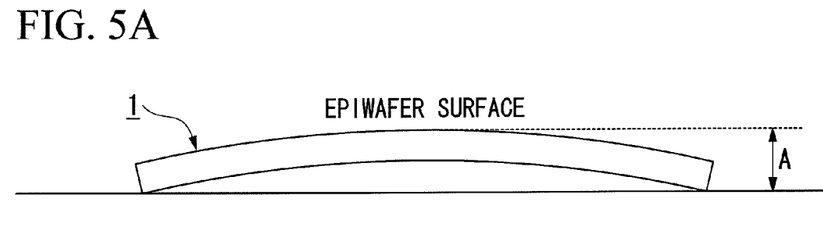
FIG. 5A is a diagram for describing a method of measuring the amount of warping of an epitaxial wafer for a light emitting diode according to an embodiment of the present invention.

A description of the method used for measuring the amount of warping of the epiwafer 10 in the present embodiment is described below with reference to FIG. 5A and FIG. 5B. First, as illustrated in FIG. 5A, the epiwafer 10 is mounted on a flat surface with the GaAs substrate 2 facing downward, namely with the epitaxial growth layers facing upward. In this situation, the epiwafer 10 has a convex upper surface. The height A of the center of the epiwafer 10 from the flat surface is measured.

Figure 5B:
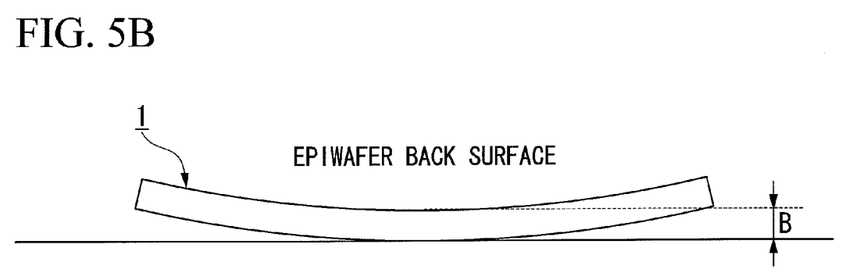
FIG. 5B is a diagram for describing a method of measuring the amount of warping of an epitaxial wafer for a light emitting diode according to an embodiment of the present invention.

Subsequently, as illustrated in FIG. 5B, the epiwafer 10 is mounted on a flat surface with the GaAs substrate 2 facing upward, namely with the epitaxial growth layers facing downward. In this situation, the epiwafer 10 has a convex lower surface. The height B of the center of the epiwafer 10 where the epiwafer contacts the flat surface (namely, the thickness of the epiwafer 10) is measured.

Finally, the value obtained by subtracting the height B from the height A (namely, the value of A–B) is calculated. This value is defined as the amount of warping of the epiwafer 10 in the present embodiment.

Figure 6:
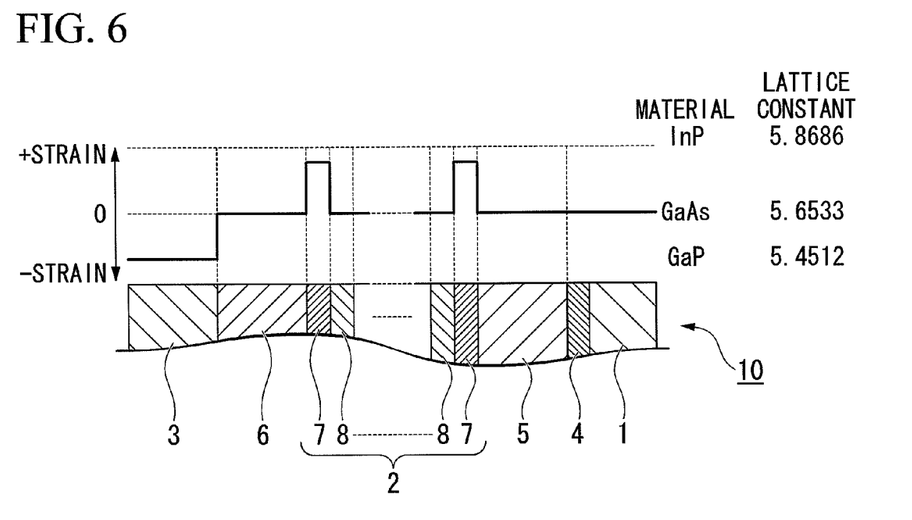
FIG. 6 is a diagram for describing the state of strain within each of the layers that constitute an epitaxial wafer for a light emitting diode according to an embodiment of the present invention.

Next is a description of the mechanism by which the strain adjustment layer 3 alleviates strain (the lattice constant relationship between the strain adjustment layer 3, and the GaAs substrate 1 and light emitting unit 2), with reference to FIG. 6.

As illustrated in FIG. 6, the lattice constant of the strain adjustment layer 3 is smaller than the lattice constant of the GaAs substrate 1 that acts as the standard. This state is referred to as – (negative) strain. In contrast, the lattice constant of the strained light emitting layer 7 within the light emitting unit 2 has a larger value than the lattice constant of the GaAs substrate 1 that acts as the standard. This is referred to as + (positive) strain. In the present invention, it was discovered that the existence of – strain caused by the strain adjustment layer 3 had the effect of reducing fluctuation in the + strain which must be introduced into the strained light emitting layer 7 in order to lengthen the emission wavelength. As described above, the emission wavelength of the strained light emitting layer 7 is determined by the thickness, the composition and the amount of warping of the strained light emitting layer 7. In this manner, because the number of factors that influence the emission wavelength of the strained light emitting layer 7 is large, the degree of fluctuation in the emission wavelength tends to increase due to a synergistic effect of the fluctuation in each of these factors.

For example, the strained light emitting layer 7 is preferably a thin film having a thickness of not more than 30 nm, but being a thin film, controlling the thickness to achieve uniform thickness is problematic. Because there is a correlation between the thickness and the amount of introduced strain, fluctuations in the thickness of the strained light emitting layer 7 causes fluctuations in the amount of introduced strain, resulting in fluctuations in the emission wavelength of the strained light emitting layer 7. It was discovered that by providing the strain adjustment layer 3 on top of the light emitting unit 2 which contains the strained light emitting layers 7 having + strain, the – strain of this strain adjustment layer 3 was able to bring the strain that had deviated significantly towards the + side as a result of fluctuation in the thickness of the strained light emitting layer 7 back towards the – side, thereby reducing the fluctuation in the amount of strain within the strained light emitting layer 7. This effect of the strain adjustment layer 3 operates in a similar manner in those cases where the cause of the fluctuation in the amount of strain in the strained light emitting layer 7 is fluctuation in the composition of the strained light emitting layer 7.

In the structure of a conventional epitaxial wafer for a light emitting diode that lacks the strain adjustment layer 3, because large fluctuations occur in properties such as the emission wavelength, the yield tends to decrease, and mass production has proven difficult due to an inability to satisfy quality requirements. In contrast, the epiwafer 10 of the present embodiment has a device structure that includes the strain adjustment layer 3 on top of the light emitting unit 2. It is thought that this structure has the function of adjusting the strain of light emitting layers in which the strain has deviated considerably to the + side. As a result, the amount of strain within the strained light emitting layer 7, which is necessary in order to achieve the desired wavelength lengthening, can be made more uniform within the plane of each individual wafer as well as between wafers, thereby reducing fluctuations in the emission wavelength and the output. Further, the surface state of the epiwafer 10 is also improved. As a result, the production of large diameter wafers having a diameter of 75 mm or greater, and the simultaneous growing of multiple wafers having a combined epitaxial growth surface area of 350 cm$^2$ or greater becomes possible, enabling a dramatic improvement in productivity.

As illustrated in FIG. 1, the buffer layer 4 is provided on top of the GaAs substrate 1. The buffer layer 4 has a function of reducing the transmission of crystal defects and lattice strain from the substrate used for epitaxial growth.

Accordingly, if the quality of the substrate and the epitaxial growth conditions are selected appropriately, the buffer layer 4 may not be necessary. Further, the material of the buffer layer 4 is preferably the same material as that of the epitaxial growth substrate. In other words, in the present embodiment, the buffer layer 4 preferably employs the same GaAs as the GaAs substrate 1. In order to reduce the transmission of defects, the buffer layer 4 may employ a multilayer film composed of different materials from the GaAs substrate 1. The thickness of the buffer layer 4 is preferably at least 0.1 μm, and is more preferably 0.2 μm or greater.

As illustrated in FIG. 1, the lower cladding layer 5 and the upper cladding layer 6 are provided on the lower surface and upper surface respectively of the light emitting unit 2. Specifically, the lower cladding layer 5 is provided on the lower side of the light emitting unit 2 (on the side of the GaAs substrate 1) and the upper cladding layer 6 is provided on the upper side of the light emitting unit 2 (on the side of the strain adjustment layer 3). This forms a structure in which the light emitting unit 2 is sandwiched from above and below by the lower cladding layer 5 and the upper cladding layer 6.

The material for the lower cladding layer 5 and the upper cladding layer 6 is preferably lattice matched to the buffer layer 4 and preferably has a larger band gap than the strained light emitting layer 7. A material that has a larger band gap than the barrier layer 8 is even more preferred. Examples of such materials include compounds having a composition represented by $Al_XGa_{1-X}As$ and compounds having a composition represented by $(Al_XGa_{1-X})_YIn_{1-Y}P$ (wherein X and Y are numerical values that satisfy $0 \leq X \leq 0.1$ and $0 < Y \leq 1$ respectively). In the case of a compound having a composition represented by $Al_XGa_{1-X}As$, the value of X preferably has a lower limit of at least 0.5, and more preferably 0.6 or greater. Further, in the case of a compound having a composition represented by $(Al_XGa_{1-X})_YIn_{1-Y}P$ (wherein X and Y are numerical values that satisfy $0 \leq X \leq 0.1$ and $0 < Y \leq 1$ respectively), the value of X preferably has a lower limit of at least 0.3, and more preferably 0.5 or greater. Further, the value of Y is preferably within a range from 0.48 to 0.52, more preferably within a range from 0.49 to 0.52, and still more preferably within a range from 0.49 to 0.51.

The lower cladding layer 5 and the upper cladding layer 6 have differing polarities. The carrier concentration and thickness of both the lower cladding layer 5 and the upper cladding layer 6 may be set within conventionally preferred ranges, and these conditions are preferably optimized so as to maximize the light emission efficiency from the light emitting unit 2. Further, warping of the epiwafer 10 may also be reduced by controlling the composition of the lower cladding layer 5 and the upper cladding layer 6.

Specifically, as the lower cladding layer 5, the use of a semiconductor material composed of a Si-doped n-type $(Al_XGa_{1-X})_YIn_{1-Y}P$ (wherein X and Y are numerical values that satisfy $0.3 \leq X \leq 1$ and $0.48 < Y \leq 0.52$ respectively) is preferred. Further, the carrier concentration is preferably within a range from $1 \times 10^{17}$ to $1 \times 10^{18}$ cm$^{-3}$, and the thickness is preferably within a range from 0.5 to 2 μm. The polarity of the lower cladding layer 5 is the same as the polarity of the GaAs substrate 1 (n-type), but this need not necessarily be the case in those cases where the epiwafer 10 is used within an LED having a structure in which the GaAs substrate 1 has been removed.

As the upper cladding layer 6, the use of a semiconductor material composed of a Mg-doped p-type $(Al_XGa_{1-X})_YIn_{1-Y}P$ (wherein X and Y are numerical values that satisfy $0.3 \leq X \leq 1$ and $0.48 < Y \leq 0.52$ respectively) is preferred. Further, the carrier concentration is preferably within a range from $2 \times 10^{17}$ to $2 \times 10^{18}$ cm$^{-3}$, and the thickness is preferably within a range from 0.5 to 5 μm. The polarity of the upper cladding layer 6 (and the strain adjustment layer 3) may be selected with due consideration of the device structure. For example, as illustrated in FIG. 3 and FIG. 4, in those cases where the epiwafer 10 is applied to a light emitting diode 20 having a structure in which the electric current flows vertically, the polarity of the upper cladding layer 6 is set to a polarity (p-type) that is different from that of the GaAs substrate 1.

Further, intermediate layers may be provided between the lower cladding layer 5 and the light emitting unit 2, between the light emitting unit 2 and the upper cladding layer 6, and between the upper cladding layer 6 and the strain adjustment layer 3, in order to ensure gradual change of the band discontinuity between the layers. In such cases, each of the intermediate layers is preferably formed from a semiconductor material having a forbidden bandwidth that is midway between that of the two layers.

<Method of Producing Epitaxial Wafer>

Next is a description of a method of producing the epitaxial wafer 10 for a light emitting diode (the epiwafer 10) according to the present embodiment.

The epiwafer 10 of the present embodiment is produced by sequentially growing epitaxial growth layers composed of the buffer layer 4, the lower cladding layer 5, the light emitting unit 2, the upper cladding layer 6 and the strain adjustment layer 3 on top of the GaAs substrate 1.

In the present embodiment, conventional growth methods such as molecular beam epitaxy (MBE) and reduced-pressure metalorganic chemical vapor deposition (MOCVD) may be employed. Of these, the use of the MOCVD method, which offers superior applicability to mass production, is particularly desirable. Specifically, the GaAs substrate 1 used in the growing process is preferably subjected to preliminary treatments such as washing and heating treatments prior to the growing process in order to remove contaminants and any natural oxide film from the substrate surface. The layers that constitute the above-mentioned epitaxial growth layers can be produced by simultaneous epitaxial growth on 8 or more GaAs substrates 1 of diameter 50 to 150 mm positioned inside the MOCVD apparatus. Commercially available large-scale apparatus such as self-rotating or high-speed rotating apparatus may be used as the MOCVD apparatus.

During epitaxial growth of each of the above epitaxial growth layers, compounds such as trimethylaluminum $((CH_3)_3Al)$, trimethylgallium $((CH_3)_3Ga)$ and trimethylindium $((CH_3)_3In)$ can be used as raw materials for the group III elements. Further, bis(cyclopentadienyl)magnesium (bis-$(C_5H_5)_2Mg$) or the like can be used as a Mg doping material. Furthermore, disilane $(Si_2H_6)$ or the like can be used as a Si doping material. Moreover, phosphine $(PH_3)$ and Arsine $(AsH_3)$ and the like may be used as raw materials for the group V elements. In terms of the growing temperature used for each of the layers, in those cases where a p-type GaP is used as the strain adjustment layer 3, growth of the strain adjustment layer 3 is typically performed at a temperature within a range from 720 to 770° C., whereas the other layers are typically grown at 600 to 700° C. Moreover, the carrier concentration, thickness and temperature conditions for each layer may be selected as appropriate.

The epiwafer 10 produced in this manner has a favorable surface state with minimal crystal defects, despite having a strained light emitting layer 7. Further, the epiwafer 10 may be subjected to surface processing such as polishing of the device structure. Furthermore, the back surface of the GaAs substrate 1 may be subjected to grinding to regulate the thickness of the structure.

<Light Emitting Diode for Plant Growth>

As follows is a description of a case in which the epitaxial wafer 10 for a light emitting diode (the epiwafer 10) according to the present invention is used as a device.

As illustrated in FIG. 3 and FIG. 4, the light emitting diode 20 has a device structure employing the epiwafer 10 in which electric current flows vertically. In the light emitting diode 20, ohmic electrodes 9A and 9B that have been processed to the desired shape are provided on the upper surface of the strain adjustment layer 3 and the lower surface of the GaAs substrate 1 respectively. Conventional electrode materials may be used for these ohmic electrodes 9A and 9B. For example, AuGe or the like may be used for an n-type electrode, and AuBe or the like may be used for a p-type electrode.

The light emitting diode 20 can be produced by forming the ohmic electrodes 9A and 9B on the upper and lower surfaces respectively of the epiwafer 10, using a dicing method to cut the wafer into chips of the desired size, and then removing the fractured layers by etching.

Figure 7:
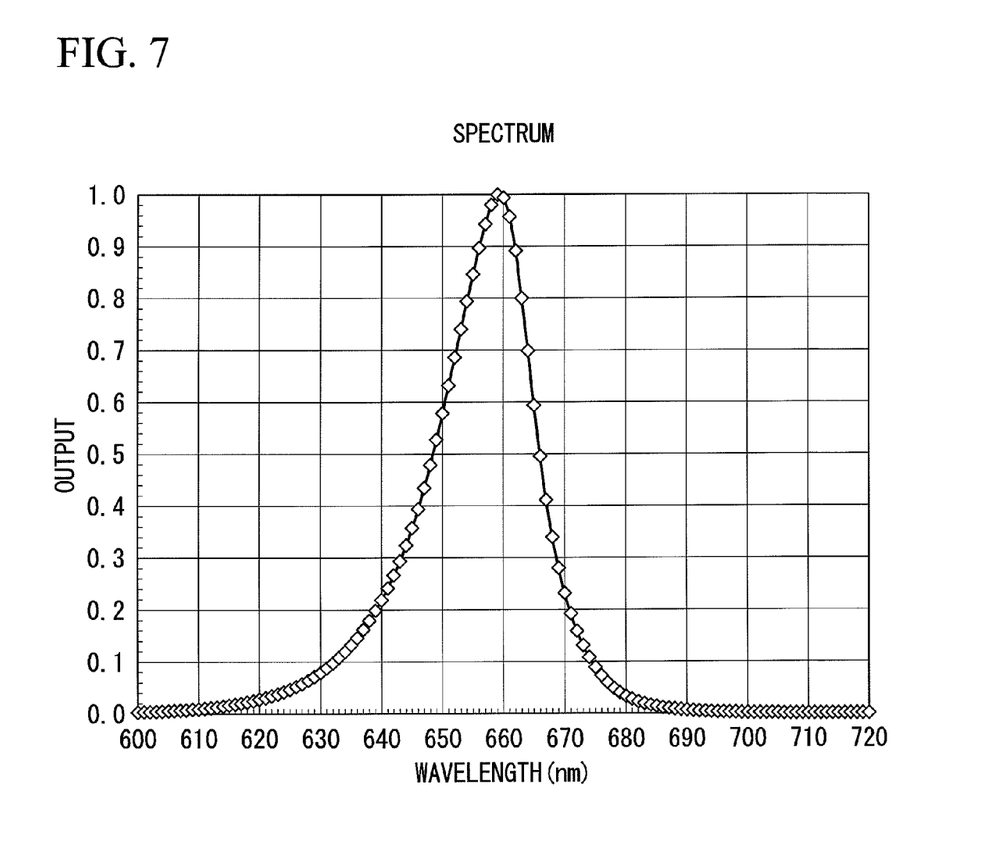
FIG. 7 is a diagram illustrating the emission spectrum of a light emitting diode according to an embodiment of the present invention.

An emission spectrum of the light emitting diode 20 produced using the epiwafer 10 of the present embodiment is shown in FIG. 7. As illustrated in FIG. 7, the emission spectrum of the light emitting diode 20 has a peak emission wavelength within a range from 655 to 675 nm. Further, the emission intensity at an emission wavelength of 700 nm is less than 10% of the emission intensity at the peak emission wavelength. Accordingly, the light emitting diode 20 produced using the epiwafer 10 can be used favorably as the illumination for promoting photosynthesis during plant growth.

As described above, in the epiwafer 10 according to the present embodiment, the light emitting unit 2 containing the strained light emitting layer 7 having a composition formula of $(Al_XGa_{1-X})_YIn_{1-Y}P$ (wherein X and Y are numerical values that satisfy $0 \leq X \leq 0.1$ and $0.39 \leq Y \leq 0.45$ respectively) is provided on the GaAs substrate 1. By using AlGaInP as the material for the strained light emitting layer 7, the light emission efficiency of the strained light emitting layer 7 can be improved. Further, by restricting the composition of the strained light emitting layer 7 to the ranges described above, the emission wavelength from the strained light emitting layer 7 can be adjusted to not less than 655 nm.

Furthermore, in the epiwafer 10 of the present embodiment, the strain adjustment layer 3 is provided on top of the light emitting unit 2. This strain adjustment layer 3 is transparent to the emission wavelength, and therefore when the light emitting diode 20 is produced using this epiwafer 10, light emission from the light emitting unit 2 is not absorbed by the strain adjustment layer 3. Moreover, because this strain adjustment layer 3 has a smaller lattice constant than that of the GaAs substrate 1, the amount of warping of the overall epiwafer 10 can be reduced. Accordingly, the occurrence of defects within the strained light emitting layer 7 can be suppressed.

The epiwafer 10 of the present embodiment provides an epitaxial wafer that enables mass production of a high-output and/or high-efficiency LED having an emission wavelength of not less than 655 nm.

EXAMPLES

The effects of the present invention are described in further detail below using a series of examples, although the present invention is in no way limited by these examples.

In the examples, specific descriptions are provided of examples of producing light emitting diodes using an epitaxial wafer for a light emitting diode according to the present invention. The light emitting diodes produced in the examples are red light emitting diodes having an AlGaInP light emitting unit. In the examples, an epiwafer was prepared by growing epitaxial growth layers including a strain adjustment layer composed of GaP on top of a GaAs substrate. In order to evaluate the properties of the wafer, light emitting diode chips were prepared, and evaluations were made of the property fluctuations within the wafer plane and between wafers.

Example 1

In a light emitting diode of Example 1, first, an epitaxial wafer was prepared by sequentially stacking epitaxial growth layers on top of a semiconductor substrate composed of monocrystalline Si-doped n-type GaAs. In the GaAs substrate, the growth plane was inclined 15° from the (100) plane towards the (0-1-1) direction, and the carrier concentration was $2 \times 10^{18}$ cm$^{-3}$. The epitaxial growth layers included a buffer layer composed of Si-doped n-type GaAs, a low-resistance layer composed of Si-doped n-type $(Al_{0.5}Ga_{0.5})_{0.5}In_{0.5}P$, a lower cladding layer composed of Si-doped n-type $Al_{0.5}In_{0.5}P$, a strained light emitting layer/barrier layer composed of pairs of undoped $Ga_{0.44}In_{0.56}P/(Al_{0.53}Ga_{0.47})_{0.5}In_{0.5}P$, an upper cladding layer composed of Mg-doped p-type $Al_{0.5}In_{0.5}P$, a thin-film intermediate layer composed of $(Al_{0.6}Ga_{0.4})_{0.5}In_{0.5}P$, and a strain adjustment layer composed of Mg-doped p-type GaP.

In this example, a reduced-pressure metalorganic chemical vapor deposition apparatus (MOCVD apparatus) was used, and epitaxial wafers were formed by simultaneous growth on 18 GaAs substrates each having a diameter of 76 mm and a thickness of 350 μm. During growth of the epitaxial growth layers, trimethylaluminum $((CH_3)_3Al)$, trimethylgallium $((CH_3)_3Ga)$ and trimethylindium $((CH_3)_3In)$ were used as the raw materials for the group III elements. Further, bis(cyclopentadienyl)magnesium $(bis-(C_5H_5)_2Mg)$ was used as the Mg doping material. Furthermore, disilane $(Si_2H_6)$ was used as the Si doping material. Moreover, phosphine $(PH_3)$ and Arsine $(AsH_3)$ were used as the raw materials for the group V elements. In terms of the growing temperature used for each of the layers, growth of the strain adjustment layer composed of p-type GaP was performed at 770° C., whereas each of the other layers was grown at 680° C.

The buffer layer composed of GaAs had a carrier concentration of approximately $2 \times 10^{18}$ cm$^{-3}$ and a thickness of approximately 0.5 μm. The low-resistance layer had a carrier concentration of approximately $3 \times 10^{18}$ cm$^{-3}$ and a thickness of approximately 3 μm. The lower cladding layer had a carrier concentration of approximately $2 \times 10^{18}$ cm$^{-3}$ and a thickness of approximately 0.5 μm. The strained light emitting layer was composed of a layer of undoped $Ga_{0.44}In_{0.56}P$ with a thickness of approximately 17 nm, and the barrier layer was composed of a layer of undoped $(Al_{0.53}Ga_{0.47})_{0.5}In_{0.5}P$ with a thickness of approximately 19 nm. 22 pairs of the strained light emitting layer and barrier layer were stacked in an alternating manner. The upper cladding layer had a carrier concentration of approximately $8 \times 10^{17}$ cm$^{-3}$ and a thickness of approximately 0.5 μm. The intermediate layer had a carrier concentration of approximately $8 \times 10^{17}$ cm$^{-3}$ and a thickness of approximately 0.05 μm. The strain adjustment layer composed of GaP had a carrier concentration of approximately $3 \times 10^{18}$ cm$^{-3}$ and a thickness of approximately 9 μm.

Next, in order to reduce the thickness of the epiwafer to 250 μm, the GaAs substrate was subjected to grinding to alter the thickness.

Subsequently, a vacuum deposition method was used to deposit 0.2 μm of AuBe and 1 μm of Au on the surface of the strain adjustment layer composed of GaP that constitutes part of the epitaxial growth layers. A typical photolithography technique was then used to perform patterning, thus forming a circular p-type ohmic electrode having a diameter of 100 µm.

Next, a vacuum deposition method was used to deposit 0.5 µm of AuGe and a Ni alloy and 1 µm of Au on the back surface of the GaAs substrate 1, thus forming an n-type ohmic electrode.

Subsequently, alloying was performed by conducting a heat treatment at 450° C. for 10 minutes, thus completing formation of low-resistance p-type and n-type ohmic electrodes.

Next, a dicing saw was used to cut the GaAs substrate at intervals of 350 µm, thus forming a series of chips. Fractured layers and soiling caused by the dicing were removed by etching with a mixed solution of sulfur acid and hydrogen peroxide, completing preparation of light emitting diodes of Example 1.

The light emitting diode chips of Example 1 prepared in the manner described above were sampled uniformly, and 17 light emitting diode lamps each mounted on a mounting substrate were assembled from each of the 18 wafers, giving a total of 17×18=306 lamps.

The results of evaluating the properties and uniformity of these light emitting diodes are shown in Table 1. As is evident from Table 1, when an electric current was passed between the n-type and p-type ohmic electrodes, red light with a peak wavelength of 660.4 nm was emitted. The forward voltage (Vf) observed when an electric current of 20 milliamperes (mA) flowed though the device in the forward direction was approximately 2.0 volts (V). Further, the emission output when the forward direction electric current was 20 mA was 4 mW. The fluctuation in the peak wavelength (maximum–minimum) across all of the assembled light emitting diode chips was 2.1 nm.

Example 2

In the light emitting diode of Example 2, only the compositions of the strained light emitting layer and the barrier layer were altered from the light emitting diode of Example 1. In the light emitting diode of Example 2, the strained light emitting layer from the above Example 1 was altered to a layer of undoped $Ga_{0.42}In_{0.58}P$ with a thickness of approximately 10 nm, the barrier layer from Example 1 was altered to a layer of undoped $(Al_{0.53}Ga_{0.47})_{0.5}In_{0.5}P$ with a thickness of approximately 30 nm, and 20 pairs of the strained light emitting layer and barrier layer were stacked in an alternating manner.

The results of evaluating the properties and uniformity of light emitting diode lamps prepared by mounting the light emitting diodes of Example 2 are shown in Table 1. As is evident from Table 1, when an electric current was passed between the n-type and p-type ohmic electrodes, red light with a peak wavelength of 660.5 nm was emitted. The forward voltage (Vf) observed when an electric current of 20 milliamperes (mA) flowed though the device in the forward direction was approximately 2.0 volts (V). Further, the emission output when the forward direction electric current was 20 mA was 3.6 mW. The fluctuation in the peak wavelength across all of the assembled light emitting diode lamps was 2.3 nm.

Example 3

In the light emitting diode of Example 3, only the composition of the strained light emitting layer was altered from the light emitting diode of Example 2. In the light emitting diode of Example 3, the strained light emitting layer from the above Example 2 was altered to a layer of undoped $Ga_{0.41}In_{0.59}P$ with a thickness of approximately 15 nm.

The results of evaluating the properties and uniformity of light emitting diode lamps prepared by mounting the light emitting diodes of Example 3 are shown in Table 1. As is evident from Table 1, when an electric current was passed between the n-type and p-type ohmic electrodes, red light with a peak wavelength of 668.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 3.7 mW. The fluctuation in the peak wavelength across all of the assembled light emitting diode lamps was 2.2 nm.

Example 4

In the light emitting diode of Example 4, only the composition of the strained light emitting layer was altered from the light emitting diode of Example 2. In the light emitting diode of Example 4, the well layer from the above Example 2 was altered to a layer of undoped $Ga_{0.45}In_{0.55}P$ with a thickness of approximately 25 nm.

The results of evaluating the properties and uniformity of light emitting diode lamps prepared by mounting the light emitting diodes of Example 4 are shown in Table 1. As is evident from Table 1, when an electric current was passed between the n-type and p-type ohmic electrodes, red light with a peak wavelength of 656.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 4.0 mW. The fluctuation in the peak wavelength across all of the assembled light emitting diode lamps was 2.1 nm.

Example 5

In the light emitting diode of Example 5, only the composition of the strained light emitting layer was altered from the light emitting diode of Example 2. In the light emitting diode of Example 5, the strained light emitting layer from the above Example 2 was altered to a layer of undoped $Ga_{0.39}In_{0.61}P$ with a thickness of approximately 10 nm.

The results of evaluating the properties and uniformity of light emitting diode lamps prepared by mounting the light emitting diodes of Example 5 are shown in Table 1. As is evident from Table 1, when an electric current was passed between the n-type and p-type ohmic electrodes, red light with a peak wavelength of 670.0 nm was emitted. The forward voltage (Vf) observed when an electric current of 20 milliamperes (mA) flowed though the device in the forward direction was approximately 2.0 volts (V). Further, the emission output when the forward direction electric current was 20 mA was 3.8 mW. The fluctuation in the peak wavelength across all of the assembled light emitting diode lamps was 2.8 nm.

Comparative Example 1

In the light emitting diode of Comparative Example 1, the surface layer from the light emitting diode of Example 2 was altered to a layer having no strain. In the light emitting diode of Comparative Example 1, the strain adjustment layer from the above Example 2 was altered to a layer of $(Al_{0.7}Ga_{0.3})_{0.5}In_{0.5}P$.

The results of evaluating the properties and uniformity of light emitting diode lamps prepared by mounting the light emitting diodes of Comparative Example 1 are shown in Table 1. As is evident from Table 1, when an electric current was passed between the n-type and p-type ohmic electrodes, red light with a peak wavelength of 660 nm was emitted. The forward voltage (Vf) observed when an electric current of 20 milliamperes (mA) flowed though the device in the forward direction was approximately 2.0 volts (V). Further, the emission output when the forward direction electric current was 20 mA was 2.5 mW. The fluctuation in the peak wavelength across all of the assembled light emitting diode lamps was 7.3 nm. The emission wavelength distribution was broad, and the properties were unsatisfactory.

Comparative Example 2

In the light emitting diode of Comparative Example 2, only the composition of the strained light emitting layer was altered from the light emitting diode of Example 2. In the light emitting diode of Comparative Example 2, the strained light emitting layer from the above Example 1 was altered to a layer of undoped $Ga_{0.38}In_{0.62}P$ with a thickness of approximately 5 nm.

The results of evaluating the properties and uniformity of light emitting diode lamps prepared by mounting the light emitting diodes of Comparative Example 2 are shown in Table 1. As is evident from Table 1, when an electric current was passed between the n-type and p-type ohmic electrodes, red light with a peak wavelength of 651.5 nm was emitted. The forward voltage (Vf) observed when an electric current of 20 milliamperes (mA) flowed though the device in the forward direction was approximately 2.0 volts (V). Further, the emission output when the forward direction electric current was 20 mA was 3.1 mW. The fluctuation in the peak wavelength across all of the assembled light emitting diode lamps was 4.3 nm. The emission wavelength decreased to less than 655 nm as a result of quantum effects, and the properties were unsatisfactory.

Comparative Example 3

In the light emitting diode of Comparative Example 3, only the composition of the strained light emitting layer was altered from the light emitting diode of Example 2. In the light emitting diode of Comparative Example 3, the composition of the strained light emitting layer from the above Example 2 was altered to $Ga_{0.37}In_{0.63}P$.

In the epitaxial wafers prepared in Comparative Example 3, crystal defects (hatching) caused by the composition of the strained light emitting layer occurred on the surface of the strain adjustment layer composed of p-type GaP.

The results of evaluating the properties and uniformity of light emitting diode lamps prepared by mounting the light emitting diodes of Comparative Example 3 are shown in Table 1. As is evident from Table 1, when an electric current was passed between the n-type and p-type ohmic electrodes, red light with a peak wavelength of 677.7 nm was emitted. The forward voltage (Vf) observed when an electric current of 20 milliamperes (mA) flowed though the device in the forward direction was approximately 2.3 volts (V). Further, the emission output when the forward direction electric current was 20 mA was 1.3 mW. The fluctuation in the peak wavelength across all of the assembled light emitting diode lamps was 3.9 nm. The emission output was low due to the above-mentioned occurrence of defects in the strain adjustment layer, and the properties were unsatisfactory.

Comparative Example 4

In the light emitting diode of Comparative Example 4, only the composition of the strained light emitting layer was altered from the light emitting diode of Example 1. In the light emitting diode of Comparative Example 4, the composition of the strained light emitting layer from the above Example 1 was altered to $Ga_{0.48}In_{0.52}P$.

The results of evaluating the properties and uniformity of light emitting diode lamps prepared by mounting the light emitting diodes of Comparative Example 4 are shown in Table 1. As is evident from Table 1, when an electric current was passed between the n-type and p-type ohmic electrodes, red light with a peak wavelength of 647.7 nm was emitted. The forward voltage (Vf) observed when an electric current of 20 milliamperes (mA) flowed though the device in the forward direction was approximately 2.0 volts (V). Further, the emission output when the forward direction electric current was 20 mA was 3.3 mW. The fluctuation in the peak wavelength across all of the assembled light emitting diode lamps was 2.5 nm. The emission wavelength decreased to less than 655 nm, and the properties were unsatisfactory.

Comparative Example 5

In the light emitting diode of Comparative Example 5, only the compositions of the strained light emitting layer and the barrier layer were altered from the light emitting diode of Example 2. In the light emitting diode of Comparative Example 5, the strained light emitting layer from the above Example 2 was altered to a layer of undoped $Ga_{0.44}In_{0.56}P$ with a thickness of approximately 30 nm, the barrier layer from Example 1 was altered to a layer of undoped $(Al_{0.53}Ga_{0.47})_{0.5}In_{0.5}P$ with a thickness of approximately 30 nm, and 12 pairs of the strained light emitting layer and barrier layer were stacked in an alternating manner.

In the epitaxial wafers prepared in Comparative Example 5, crystal defects (hatching) caused by the composition of the strained light emitting layer occurred on the surface of the strain adjustment layer composed of p-type GaP.

The results of mounting the light emitting diode of Comparative Example 5 are shown in Table 1. As is evident from Table 1, when an electric current was passed between the n-type and p-type ohmic electrodes, red light with a peak wavelength of 668.5 nm was emitted. The forward voltage (Vf) observed when an electric current of 20 milliamperes (mA) flowed though the device in the forward direction was approximately 2.3 volts (V). Further, the emission output when the forward direction electric current was 20 mA was 1.1 mW. The fluctuation in the peak wavelength across all of the assembled light emitting diode lamps was 3.7 nm. The emission output was low due to the above-mentioned occurrence of defects, and the properties were unsatisfactory.

Comparative Example 6

A light emitting diode of Comparative Example 6 was formed using the conventional technique of liquid phase epitaxy. The device structure was altered to a light emitting diode having a light emitting unit with a double hetero structure in which an $Al_{0.35}Ga_{0.65}As$ light emitting layer was formed on a GaAs substrate, and $Al_{0.7}Ga_{0.3}As$ was used as the upper and lower cladding layers.

The results of mounting the light emitting diode of Comparative Example 6 are shown in Table 1. As is evident from Table 1, when an electric current was passed between the n-type and p-type ohmic electrodes, red light with a peak wavelength of 660.7 nm was emitted. The forward voltage (Vf) observed when an electric current of 20 milliamperes (mA) flowed though the device in the forward direction was approximately 1.9 volts (V). Further, the emission output when the forward direction electric current was 20 mA was 1.2 mW. The fluctuation in the peak wavelength across all of the assembled light emitting diode lamps was 7.2 nm. The emission output was low and the emission wavelength distribution was broad, which represents unsatisfactory properties.

TABLE 1

| | Strain adjustment layer | Value of x in light emitting layer GaxIn(1-x)P | Strained light emitting layer thickness nm | Number of strained light emitting layers | Barrier layer thickness nm | Number of barrier layers | Surface defects | VF @ 20 mA V | Output @ 20 mA mW | Average wavelength nm | In-plane fluctuation in peak wavelength nm |
|---|---|---|---|---|---|---|---|---|---|---|---|
| Example 1 | GaP | 0.44 | 17 | 23 | 19 | 22 | ○ | 2.0 | 4 | 660.4 | 2.1 |
| Example 2 | GaP | 0.42 | 10 | 21 | 30 | 20 | ○ | 2.0 | 3.6 | 660.5 | 2.3 |
| Example 3 | GaP | 0.41 | 15 | 21 | 30 | 20 | ○ | 2.0 | 3.7 | 668.0 | 2.2 |
| Example 4 | GaP | 0.45 | 25 | 21 | 30 | 20 | ○ | 2.0 | 4 | 656.0 | 2.1 |
| Example 5 | GaP | 0.39 | 10 | 21 | 30 | 20 | ○ | 2.0 | 3.8 | 670.0 | 2.8 |
| Comparative example 1 | Al0.7GaInP | 0.42 | 10 | 21 | 30 | 20 | ○ | 2.0 | 2.5 | 660.0 | 7.3 |
| Comparative example 2 | GaP | 0.38 | 5 | 21 | 30 | 20 | ○ | 2.0 | 3.1 | 651.5 | 4.3 |
| Comparative example 3 | GaP | 0.37 | 10 | 21 | 30 | 20 | x | 2.3 | 1.3 | 677.7 | 3.9 |
| Comparative example 4 | GaP | 0.48 | 17 | 23 | 19 | 22 | ○ | 2.0 | 3.3 | 647.7 | 2.5 |
| Comparative example 5 | GaP | 0.44 | 30 | 13 | 30 | 12 | x | 2.3 | 1.1 | 668.5 | 3.7 |
| Comparative example 6 | AlGaAs | | | | | | ○ | 1.9 | 1.2 | 660.7 | 7.2 |

INDUSTRIAL APPLICABILITY

The light emitting diode of the present invention provides an epitaxial wafer for a light emitting diode that exhibits excellent uniformity and productivity, in which the light emitting layer composed of AlGaInP is capable of high-efficiency light emission at a long emission wavelength of not less than 655 nm. The present invention can be used in all manner of applications where conventional AlGaAs-based LEDs exhibit insufficient output to be applicable, such as plant growth applications, displays, communications, and light sources for sensors.

DESCRIPTION OF THE REFERENCE SIGNS

| | |
|---|---|
| 1: | GaAs substrate |
| 2: | Light emitting unit |
| 3: | Strain adjustment layer |
| 4: | Buffer layer |
| 5: | Lower cladding layer |
| 6: | Upper cladding layer |
| 7: | Strained light emitting layer |
| 8: | Barrier layer |
| 9A, 9B: | Ohmic electrode |
| 10: | Epitaxial wafer for a light emitting diode (epiwafer) |
| 20: | Light emitting diode |

The invention claimed is:

1. An epitaxial wafer for a light emitting diode, comprising a GaAs substrate, a pn junction-type light emitting unit provided on the GaAs substrate, and a strain adjustment layer provided on the light emitting unit,
wherein the light emitting unit has a strained light emitting layer having a composition formula of $(Al_X Ga_{1-X})_Y In_{1-Y} P$ (wherein X and Y are numerical values that satisfy $0 \leq X \leq 0.1$ and $0.39 \leq Y \leq 0.45$ respectively),
the strain adjustment layer is transparent to an emission wavelength and has a lattice constant that is smaller than a lattice constant of the GaAs substrate,
a thickness of the strained light emitting layer is within a range from 8 to 30 nm,
a peak emission wavelength of the strained light emitting layer is within a range from 655 to 675 nm, and
a thickness of the strain adjustment layer is within a range from 3 to 15 μm.

2. The epitaxial wafer for a light emitting diode according to claim 1, wherein a composition formula of the strained light emitting layer is $Ga_Y In_{1-Y} P$ (wherein Y is a number that satisfies $0.39 \leq Y \leq 0.45$).

3. The epitaxial wafer for a light emitting diode according to claim 1, wherein a composition formula of the strain adjustment layer is $(Al_X Ga_{1-X})_Y In_{1-Y} P$ (wherein X and Y are numerical values that satisfy $0 \leq X \leq 1$ and $0.6 \leq Y \leq 1$ respectively).

4. The epitaxial wafer for a light emitting diode according to claim 1, wherein a composition formula of the strain adjustment layer is $Al_X Ga_{1-X} As_{1-Y} P_Y$ (wherein X and Y are numerical values that satisfy $0 \leq X \leq 1$ and $0.6 \leq Y \leq 1$ respectively).

5. The epitaxial wafer for a light emitting diode according to claim 1, wherein a material of the strain adjustment layer is GaP.

6. The epitaxial wafer for a light emitting diode according to claim 1, wherein
the light emitting unit has a stacked structure composed of the strained light emitting layer and a barrier layer, and
the strained light emitting layer comprises 8 to 40 layers.

7. The epitaxial wafer for a light emitting diode according to claim 6, wherein a composition formula of the barrier layer is $(Al_X Ga_{1-X})_Y In_{1-Y} P$ (wherein X and Y are numerical values that satisfy $0.3 \leq X \leq 0.7$ and $0.49 \leq Y \leq 0.52$ respectively).

8. The epitaxial wafer for a light emitting diode according to claim 1, comprising a cladding layer on one or both of an upper surface and a lower surface of the light emitting unit, wherein a composition formula of the cladding layer is $(Al_XGa_{1-X})_Y In_{1-Y}P$ (wherein X and Y are numerical values that satisfy $0.5 \leqq X \leqq 1$ and $0.48 \leqq Y \leqq 0.52$ respectively).

9. The epitaxial wafer for a light emitting diode according to claim 1, wherein a range for a planar orientation of the GaAs substrate is 15°±5° off (100) direction towards (0-1-1) direction.

10. The epitaxial wafer for a light emitting diode according to claim 1, wherein a diameter of the GaAs substrate is not less than 75 mm.

11. The epitaxial wafer for a light emitting diode according to claim 10, wherein an amount of warping is not more than 200 μm.

12. The epitaxial wafer for a light emitting diode according to claim 1, which is used for promoting photosynthesis during plant growth.

13. The epitaxial wafer for a light emitting diode according to claim 12, wherein a light emission intensity of the strained light emitting layer at an emission wavelength of 700 nm is less than 10% of a light emission intensity at the peak emission wavelength.

* * * * *